United States Patent
Mori et al.

(10) Patent No.: US 8,471,351 B2
(45) Date of Patent: Jun. 25, 2013

(54) SOLID STATE IMAGING DEVICE INCLUDING SOURCE/DRAIN REGION OF AMPLIFIER TRANSISTOR BEING DISPOSED IN ISOLATION DIFFUSION LAYER

(75) Inventors: Mitsuyoshi Mori, Kyoto (JP); Toru Okino, Osaka (JP); Yusuke Otake, Toyama (JP); Kazuo Fujiwara, Toyama (JP); Hitomi Fujiwara, legal representative, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/198,451

(22) Filed: Aug. 4, 2011

(65) Prior Publication Data
US 2011/0291162 A1    Dec. 1, 2011

Related U.S. Application Data

(63) Continuation of application No. PCT/JP2009/006751, filed on Dec. 10, 2009.

(30) Foreign Application Priority Data

Apr. 22, 2009 (JP) .................. 2009-104321

(51) Int. Cl.
  *H01L 27/148* (2006.01)
  *H01L 27/146* (2006.01)
  *H01L 21/00* (2006.01)
(52) U.S. Cl.
  USPC .............. 257/445; 257/E27.139; 257/231; 257/E27.15; 438/79
(58) Field of Classification Search
  USPC ........ 257/445, E27.139, 231, E27.15; 438/79
  See application file for complete search history.

(56) References Cited

U.S. PATENT DOCUMENTS

| | | | |
|---|---|---|---|
| 5,859,462 A | 1/1999 | Tredwell et al. | |
| 6,211,509 B1* | 4/2001 | Inoue et al. | 250/208.1 |
| 2003/0127667 A1 | 7/2003 | Inoue et al. | |
| 2004/0094784 A1* | 5/2004 | Rhodes et al. | 257/291 |
| 2005/0035375 A1 | 2/2005 | Hirata | |
| 2005/0179059 A1* | 8/2005 | Rhodes et al. | 257/204 |
| 2006/0226438 A1 | 10/2006 | Katsuno et al. | |
| 2007/0131978 A1* | 6/2007 | Hirata | 257/239 |
| 2007/0262240 A1* | 11/2007 | Inoue et al. | 250/208.1 |
| 2007/0262241 A1 | 11/2007 | Inoue et al. | |
| 2008/0217718 A1* | 9/2008 | Mauritzson | 257/444 |
| 2009/0242741 A1 | 10/2009 | Konishi | |

FOREIGN PATENT DOCUMENTS

| | | |
|---|---|---|
| JP | 11-284168 | 10/1999 |
| JP | 2003-142674 | 5/2003 |
| JP | 2004-039832 | 2/2004 |
| JP | 2004-165462 | 6/2004 |
| JP | 2006-294871 | 10/2006 |
| JP | 2009-043791 | 2/2009 |

\* cited by examiner

*Primary Examiner* — Kimberly Rizkallah
*Assistant Examiner* — Alexander Belousov
(74) *Attorney, Agent, or Firm* — McDermott Will & Emery LLP

(57) ABSTRACT

Each of pixels 10 arranged in an array pattern includes a photoelectric conversion element 11, a transfer transistor 13 for transferring charges to a floating diffusion layer 12, and an amplifier transistor 14 for outputting the transferred charges to an output line. An insulating isolation part 22 isolates the adjacent photoelectric conversion elements 11, and isolates the photoelectric conversion element 11 and the amplifier transistor 14. The insulating isolation part 22 constitutes a first region A between the photoelectric conversion elements 11 where the amplifier transistor 14 is not arranged, and a second region B between the photoelectric conversion elements 11 where the amplifier transistor 14 is arranged. First and second isolation diffusion layers 23 and 24 are formed below the insulating isolation part 22, and the second isolation diffusion layer 24 is wider than the first isolation diffusion layer 23 in the first region A.

5 Claims, 11 Drawing Sheets

(a)

(b)

(a)

(a)

(b)

SOLID STATE IMAGING DEVICE INCLUDING SOURCE/DRAIN REGION OF AMPLIFIER TRANSISTOR BEING DISPOSED IN ISOLATION DIFFUSION LAYER

CROSS-REFERENCE TO RELATED APPLICATION

This is a continuation of PCT International Application PCT/JP2009/006751 filed on Dec. 10, 2009 which claims priority to Japanese Patent Application No. 2009-104321 filed on Apr. 22, 2009. The disclosures of these applications including the specifications, the drawings, and the claims are hereby incorporated by reference in their entirety.

BACKGROUND

The present disclosure relates to solid state imaging devices in which pixels including photoelectric conversion elements are arranged in an array pattern.

Much attention has been paid to MOS-type solid state imaging devices due to their low power consumption, and high-speed imaging. The MOS-type solid state imaging devices have been and are being employed in various fields, such as cameras of mobile devices, on-board cameras, monitoring cameras, etc.

FIG. 6 shows a circuit diagram illustrating a structure of a conventional MOS-type solid state imaging device. As shown in FIG. 6, pixels 100 including photoelectric conversion elements (photodiodes) 101, respectively, are arranged in an array pattern to constitute an imaging region 200. Charges produced by photoelectric conversion of the photoelectric conversion element 101 are transferred to a floating diffusion layer 102 by a transfer transistor 103. The charges transferred to the floating diffusion layer 102 are amplified by an amplifier transistor 104, and are transferred to an output signal line 110 through a selection transistor 106 which is selected by a vertical shift register 108, and are output from an output end 111 through a horizontal shift register 109. A surplus of the charges accumulated in the floating diffusion layer 102 is discharged by a reset transistor 105 having a drain region connected to a power supply line 107.

FIG. 7 is a cross-sectional view illustrating a general structure of the pixels 100. As shown in FIG. 7, the photoelectric conversion elements 101, the floating diffusion layers 102, and source/drain regions of the amplifier transistors 104 are formed in a substrate 201. The pixels 100 adjacent to each other are electrically isolated from each other by an insulating isolation part 202.

Long wavelength light incident on the substrate 201, such as red light, travels to a deeper region in the substrate 201. Thus, when some of the charges produced by photoelectric conversion leak to the adjacent pixel 100, mixing of colors, or blooming may occur. To prevent the mixing of colors etc. due to the leakage of the charges, Japanese Patent Publication No. H11-284168, U.S. Pat. No. 5,859,462, etc. describe a method for forming a narrow and deep isolation diffusion layer 204 below a shallow isolation diffusion layer 203 formed below the insulating isolation part 202 as shown in FIG. 7.

When operating speed of the solid state imaging device is increased, and a potential of the substrate 210 in which the amplifier transistors 104 are formed varies during high-speed operation of the amplifier transistors, operation of the amplifier transistors becomes unstable. Thus, as shown in FIG. 7, high concentration well regions 205 are formed in the substrate 201 to form the amplifier transistors 104 in the high concentration well regions 205. This can reduce change in potential of the well regions 205 even when the amplifier transistors 104 are operated at high speed. Thus, the amplifier transistors 104 can stably be operated.

SUMMARY

In a layout including the plurality of pixels 100 arranged in an array pattern, the insulating isolation part 202 which electrically isolates the adjacent pixels 100 constitutes a region between the photoelectric conversion elements 101 where the amplifier transistor 104 is not arranged, and a region between the photoelectric conversion elements 101 where the amplifier transistor 104 is arranged. Thus, the region between the photoelectric conversion elements 101 where the amplifier transistor 104 is not arranged is the narrowest insulating isolation part 202.

When the narrowest insulating isolation part 202 is further narrowed in accordance with miniaturization of the pixels 100, a lower portion of the photoelectric conversion element 101 is widened toward the deep isolation diffusion layer 204 because the deep isolation diffusion layer 204 is narrower than the shallow isolation diffusion layer 203. Thus, long wavelength light (red light) which obliquely entered the substrate 201 travels to the horizontally widened lower portion of the photoelectric conversion element 101, some of the charges produced by the photoelectric conversion may leak to the adjacent pixel 100, and the mixing of colors, or blooming may occur.

In view of the foregoing, the present disclosure is intended to provide a solid state imaging device which can be operated with high resolution and high sensitivity without causing the mixing of colors, or blooming, even when the solid state imaging device is miniaturized.

A solid state imaging device according to an aspect of the present disclosure is a solid state imaging device including: a plurality of pixels arranged in an array pattern, wherein each of the pixels includes a photoelectric conversion element which is formed with a first conductivity type diffusion region formed in a substrate, a transfer transistor for transferring charges accumulated in the photoelectric conversion element to a floating diffusion layer, and an amplifier transistor for outputting the charges transferred to the floating diffusion layer to an output line, an insulating isolation part electrically isolates the photoelectric conversion elements adjacent to each other, and electrically isolates the photoelectric conversion element and the amplifier transistor, the insulating isolation part constitutes at least a first region between the photoelectric conversion elements where the amplifier transistor is not arranged, and a second region between the photoelectric conversion elements where the amplifier transistor is arranged, a second conductivity type isolation diffusion layer is formed below the insulating isolation part, the isolation diffusion layer is formed with a first isolation diffusion layer, and a second isolation diffusion layer formed below the first isolation diffusion layer, and the second isolation diffusion layer formed below the insulating isolation part is wider than the first isolation diffusion layer in the first region.

With this configuration, even in the narrowest insulating isolation part constituting the first region, widening of the lower portion of the photoelectric conversion element toward the second isolation diffusion layer can be prevented. This can prevent leakage of some of the charges produced by photoelectric conversion to the adjacent photoelectric conversion element even when long wavelength light (red light) travels to the lower portion of the photoelectric conversion element. Since the first isolation diffusion layer is narrower than the second isolation diffusion layer, a shallow portion of the photoelectric conversion element is increased in opening area, thereby increasing sensitivity to short wavelength light (blue or green light). Thus, the solid state imaging device can be provided with high resolution and high sensitivity, and can be operated without causing the mixing of colors, or blooming, even when the solid state imaging device is miniaturized.

In a preferred embodiment, a source/drain region of the amplifier transistor between the insulating isolation parts constituting the second regions is formed in a well region which is formed simultaneously with the first isolation diffusion layer, and the second isolation diffusion layer formed below the insulating isolation part constituting the second region is wider than the second isolation diffusion layer formed below the insulating isolation part constituting the first region.

With this configuration, sheet resistance of the well region can be reduced, and change in potential of the well region can be reduced even when the amplifier transistor 104 is operated at high speed. This allows high speed operation of the amplifier transistor with stability.

In a preferred embodiment, an impurity concentration of the first isolation diffusion layer is higher than an impurity concentration of the second isolation diffusion layer.

In a preferred embodiment, the first isolation diffusion layer and the second isolation diffusion layer are formed by performing multiple ion implantations at different energy levels.

According to the present disclosure, the solid state imaging device can reduce the mixing of color, or blooming, and can maintain high resolution and high sensitivity even when the solid state imaging device is miniaturized.

BRIEF DESCRIPTION OF THE DRAWINGS

FIG. 4A is a cross-sectional view taken along the line IIa-IIa indicated in FIG. 1, and FIG. 4B is a cross-sectional view taken along the line IIb-IIb indicated in FIG. 1.

DETAILED DESCRIPTION

An embodiment of the present invention will be described in detail with reference to the drawings. The present invention is not limited to the following embodiment. The embodiment may be modified within the scope of the present invention.

Figure 6:
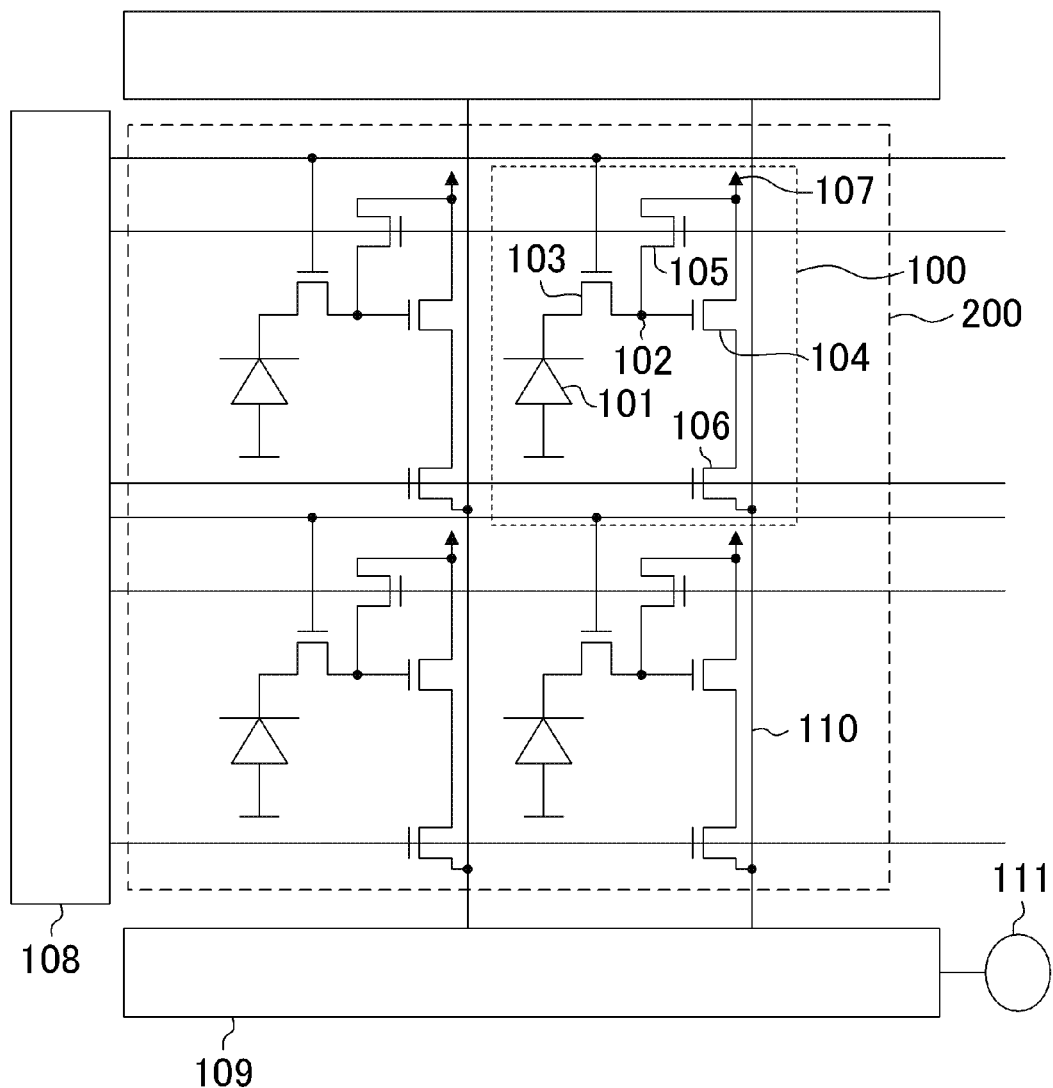
FIG. 6 is a circuit diagram illustrating a structure of a conventional MOS-type solid state imaging device.
Figure 7:
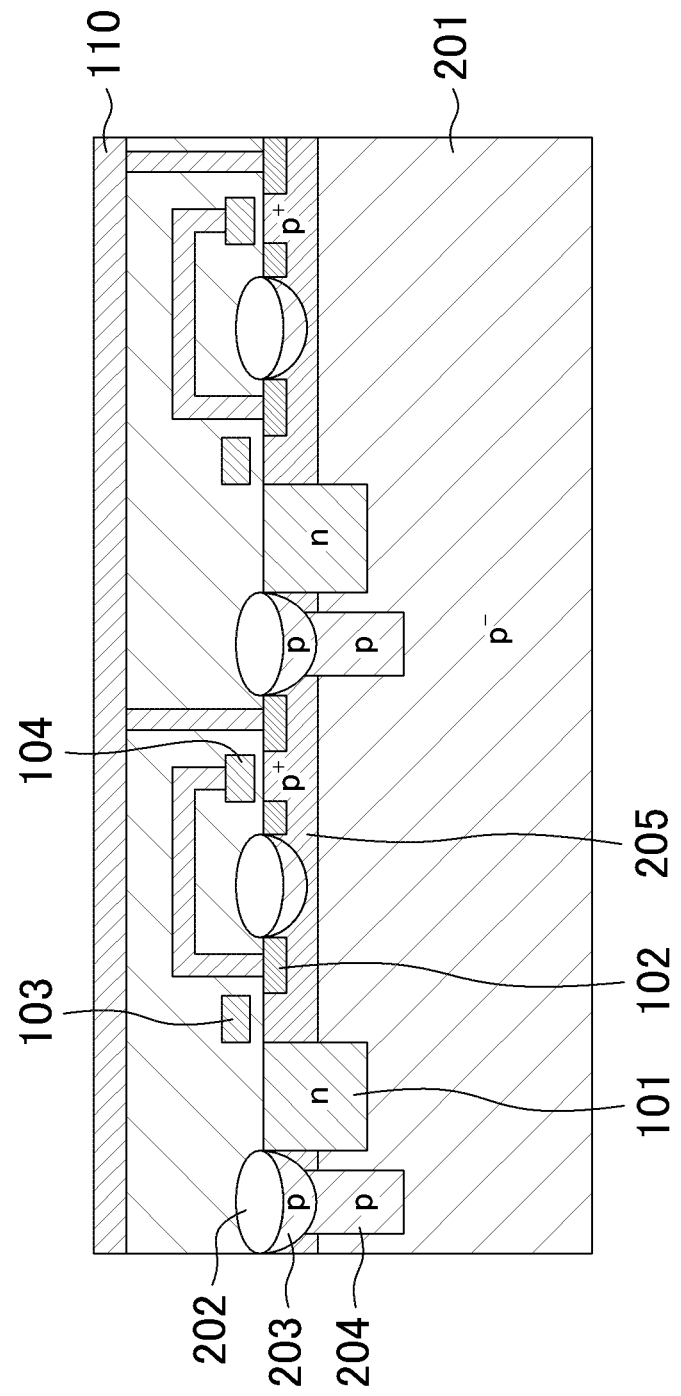
FIG. 7 is a cross-sectional view illustrating a structure of conventional pixels.

A solid state imaging device of the present invention is a MOS-type solid state imaging device including a plurality of pixels arranged in an array pattern. A circuit structure thereof is basically the same as that shown in FIG. 6.

Figure 1:
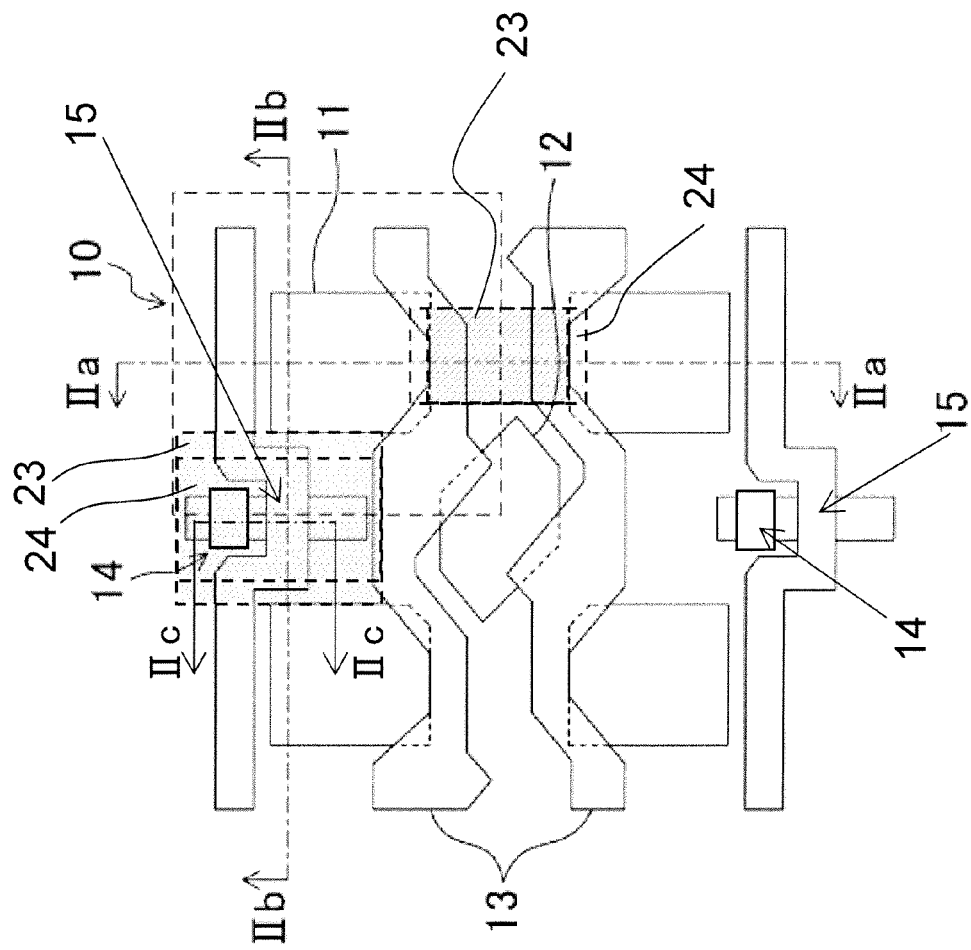
FIG. 1 is a plan view illustrating a layout of pixels arranged in an array pattern according to a first embodiment of the present invention.
Figure 2:
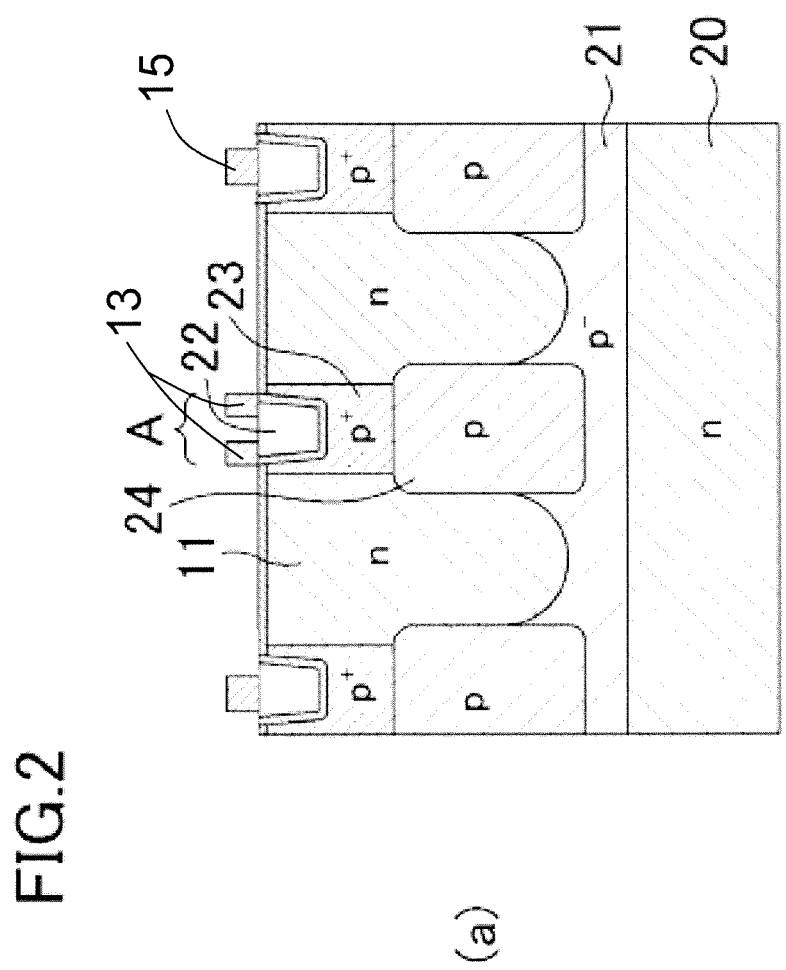
FIG. 2A is a cross-sectional view taken along the line IIa-IIa indicated in FIG. 1.
FIG. 2B is a cross-sectional view taken along the line IIb-IIb indicated in FIG. 1.
FIG. 2C is a cross-sectional view taken along the line IIc-IIc indicated in FIG. 1.
Figure 2:
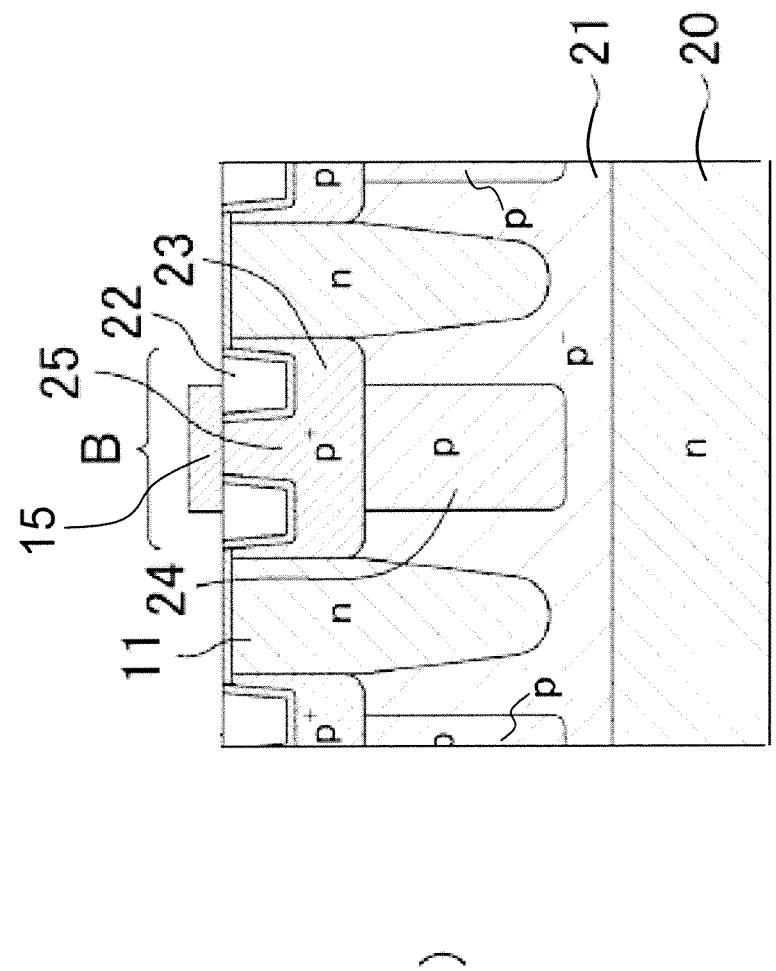
Figure 2:
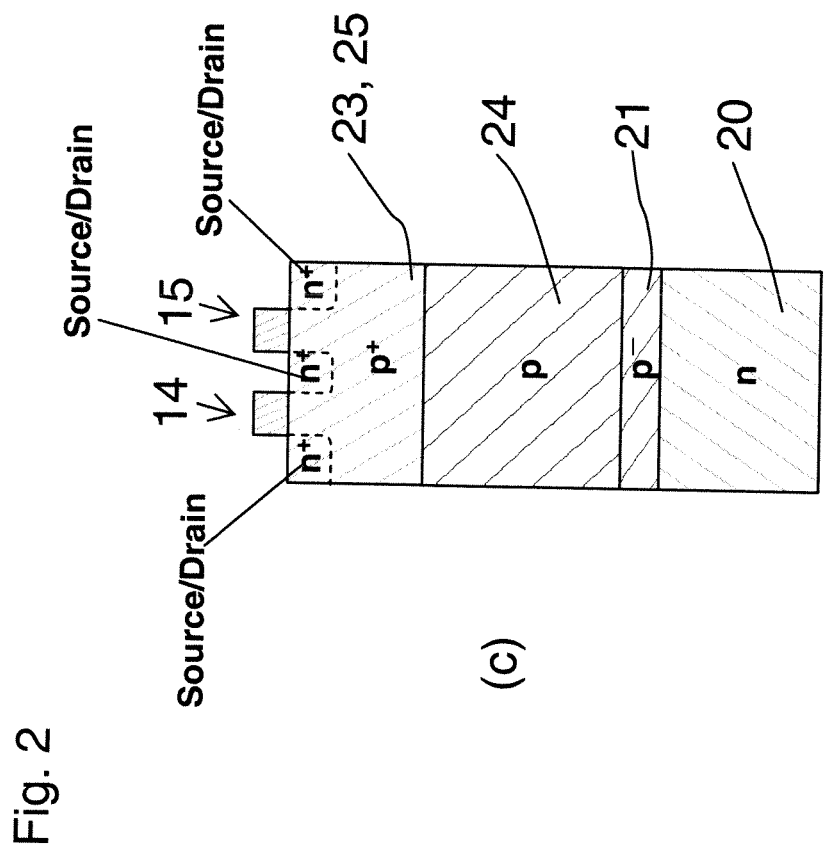

FIG. 1 is a plan view illustrating a layout of pixels 10 arranged in an array pattern (2×2) according to an embodiment of the present invention. FIG. 2A is a cross-sectional view taken along the line IIa-IIa indicated in FIG. 1, and FIG. 2B is a cross-sectional view taken along the line IIb-IIb indicated in FIG. 1.

As shown in FIGS. 1, 2A, 2B, and 2C, each of the pixels 10 includes a photoelectric conversion element (a photodiode) 11 formed with an n-type (first conductivity type) diffusion region formed in a substrate (an n-type semiconductor substrate 20 on which a p⁻ semiconductor layer 21 is formed), a transfer transistor 13 for transferring charges accumulated in the photoelectric conversion element 11 to a floating diffusion layer 12, an amplifier transistor 14 for outputting the charges transferred to the floating diffusion layer 12 to an output line (not shown), and a reset transistor 15 for discharging a surplus of the charges accumulated in the floating diffusion layer 12.

As shown in FIG. 1, the floating diffusion layer 12 and the amplifier transistor 14 are arranged to be shared by adjacent pixels 10 (pixels adjacent to each other in the vertical direction in FIG. 1). Specifically, the floating diffusion layer 12 and the amplifier transistor 14 are not arranged between the vertically adjacent pixels. Thus, the photoelectric conversion elements 11 can be elongated in the vertical direction to increase a region of the photoelectric conversion elements 11. The charges accumulated in the vertically adjacent photoelectric conversion elements 11 are separately transferred to the floating diffusion layer 12 through the transfer transistors 13 of the corresponding pixels 10. Thus, the charges from the different pixels are not mixed.

An insulating isolation part 22 electrically isolates the photoelectric conversion elements 11 adjacent to each other, and electrically isolates the photoelectric conversion element 11 and the amplifier transistor 14. The insulating isolation part 22 constitutes a first region A between the photoelectric conversion elements 11 where the amplifier transistor 14 is not arranged as shown in FIG. 2A, and a second region B between the photoelectric conversion elements 11 where the amplifier transistor 14 is arranged as shown in FIG. 2B.

A p-type (second conductivity type) isolation diffusion layer is formed below the insulating isolation part 22. The isolation diffusion layer is formed with a first isolation diffusion layer 23, and a second isolation diffusion layer 24 which is formed below the first isolation diffusion layer 23. As shown in FIG. 2A, the second isolation diffusion layer 24 formed below the insulating isolation part 22 constituting the first region A is wider than the first isolation diffusion layer 23.

With this configuration, even in the narrowest insulating isolation part 22 constituting the first region A, widening of a lower portion of the photoelectric conversion element 11 toward the second isolation diffusion layer 24 can be prevented. Thus, leakage of some of the charges produced by photoelectric conversion to the adjacent photoelectric conversion element 11 can be prevented even when light travels to the lower portion of the photoelectric conversion element 11. Since the first isolation diffusion layer 23 is narrower than the second isolation diffusion layer 24 is, a shallow portion of the photoelectric conversion element 11 is increased in opening area, thereby increasing sensitivity to short wavelength light (blue or green light). Thus, the solid state imaging device can be provided with high resolution and high sensitivity, and can be operated without causing mixing of colors, or blooming, even when the solid state imaging device is miniaturized.

As shown in FIG. 2B and FIG. 2C, a source/drain region of the amplifier transistor 14 between the insulating isolation parts 22 constituting the second regions B is formed in a well region 25 which is formed simultaneously with the first isolation diffusion layer 23.

With this configuration, the amplifier transistor 14 is formed in the high concentration well region 25. This can reduce change in potential of the well region 25 even when the amplifier transistor 14 is operated at high speed, thereby allowing stable operation of the amplifier transistor 14.

A distance between the adjacent photoelectric conversion elements 11 in the second region B is larger than a distance between the adjacent photoelectric conversion elements 11 in the first region A. Thus, it is not necessary to widen the second isolation diffusion layer 24 formed below the insulating isolation part 22 than the first isolation diffusion layer 23. With an impurity concentration of the first isolation diffusion layer 23 set higher than an impurity concentration of the second isolation diffusion layer 24, the well region 25 having higher concentration can be formed, and the amplifier transistor 14 can be operated more stably.

The same advantage as that described above can be obtained by forming the well region for forming the transistors simultaneously with the first isolation diffusion layer 23 below the insulating isolation part 22 between the photoelectric conversion elements 11 where the reset transistor 15 or a selection transistor is arranged.

In the present disclosure, impurity concentrations of the first isolation diffusion layer 23 and the second isolation diffusion layer 24 may not necessarily be uniform. The first isolation diffusion layer 23 and the second isolation diffusion layer 24 can be formed by performing multiple ion implantations at different energy levels. For example, when the photoelectric conversion element 11 extends to a depth of about 1 μm, the second isolation diffusion layer 24 can be formed to extend to a depth greater than that of the photoelectric conversion element 11 by performing ion implantation three or more times at different energy levels in the range of 300 keV-3000 keV.

The first isolation diffusion layer 23 typically has an impurity concentration in the range of $1E15$-$1E20/cm^3$, and the second isolation diffusion layer 24 typically has an impurity concentration of $1E14$-$1E19/cm^3$.

Figure 3:
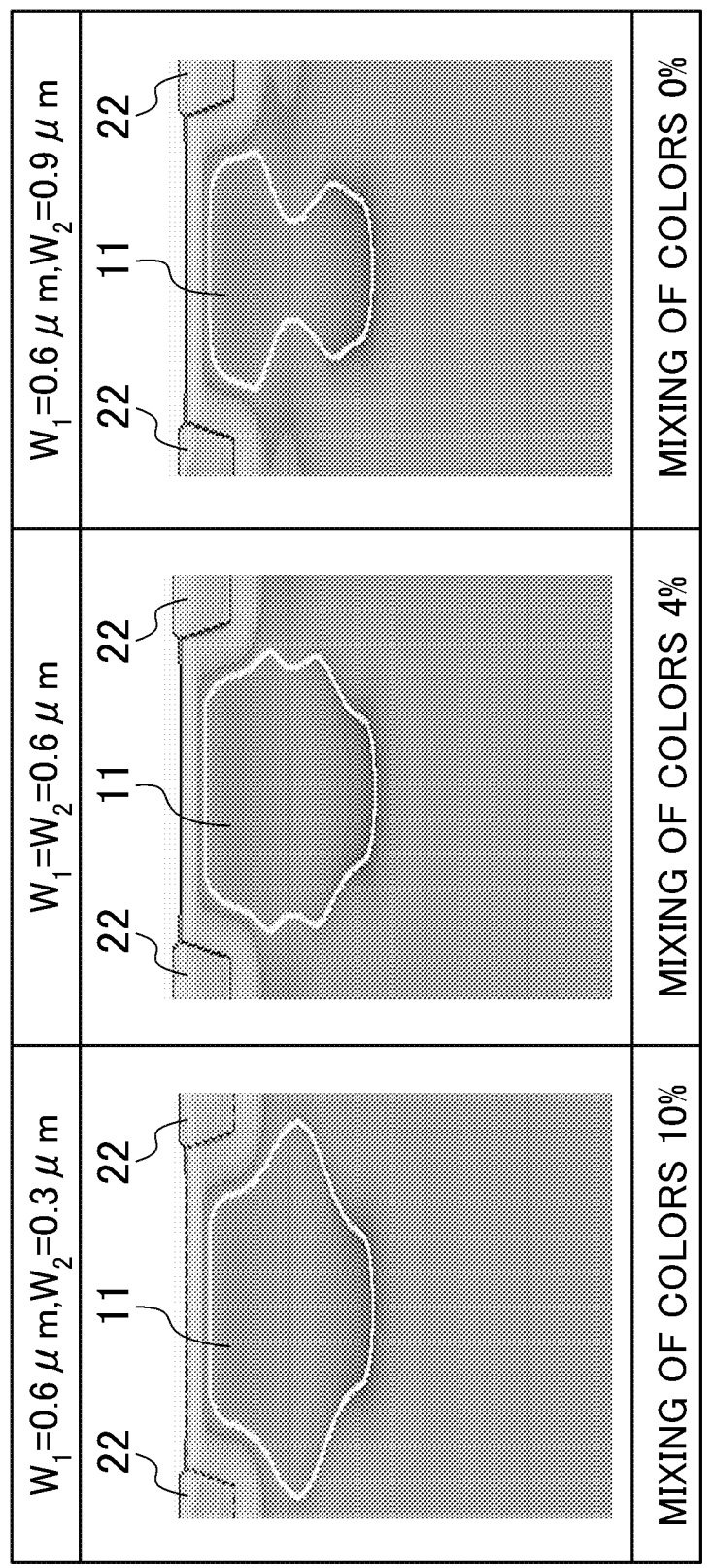
FIGS. 3A to 3C show shapes of photoelectric conversion elements when second isolation diffusion layers of different widths are formed, and rates of occurrence of color mixing.

FIGS. 3A-3C show shapes of the photoelectric conversion elements 11 obtained when the second isolation diffusion layers of different widths are formed below the insulating isolation part 22 constituting the first region A shown in FIG. 2A, and rates of occurrence of color mixing.

In forming the isolation diffusion layers, a width of the insulating isolation part 22 was set to 0.6 μm, width $W_1$ of the first isolation diffusion layer 23 was set to 0.6 μm, and width $W_2$ of the second isolation diffusion layer 24 was changed to 0.3 μm, 0.6 μm, and 0.9 μm. The first isolation diffusion layer 23 was formed by performing ion implantations three times at an impurity concentration of $1E19/cm^3$, and different implantation energies of 100 keV, 200 keV, and 300 keV. The second isolation diffusion layer 24 was formed by performing ion implantations four times at an impurity concentration of $1E18/cm^3$, and different implantation energies of 400 keV, 600 keV, 800 keV, and 1000 keV.

A red filter was provided in one of adjacent pixels, and a blue filter was provided in the other pixel. Then, red light (650 nm) was allowed to incident on the pixels, and output of the pixel with the blue filter relative to output of the pixel with the red filter was measured to obtain a rate of occurrence of color mixing.

As shown in FIG. 3C, when the width $W_2$ of the second isolation diffusion layer 24 is larger than the width $W_1$ of the first isolation diffusion layer 23, a lower portion of the photoelectric conversion element 11 is less widened toward the second isolation diffusion layer 24. As a result, the rate of occurrence of the color mixing is reduced from 10% to 0%. This is presumably because leakage of some of the charges produced by photoelectric conversion to the adjacent photoelectric conversion element 11 is prevented even when the red light traveled to the lower portion of the photoelectric conversion element 11.

In the present disclosure, the "substrate" designates a base material in which the photoelectric conversion elements 11 are formed. Thus, the "substrate" of the present disclosure is not limited to the structure shown in FIGS. 2A and 2B including the n-type semiconductor substrate 20 and the p⁻ semiconductor layer 21 formed thereon, and can be modified in various ways. For example, an n-type epitaxial layer may be formed on the n-type semiconductor substrate 20, and the p⁻ semiconductor layer 21 may be formed on the n-type epitaxial layer. A p-type substrate may be used alone. When the n-type semiconductor substrate 20 is used, leakage of the charges generated below the insulating isolation part 22 by photoelectric conversion to the photoelectric conversion element 11 can be prevented by applying a power supply voltage to the n-type semiconductor substrate 20. When a substrate including a high concentration p-type semiconductor substrate and a p-type semiconductor layer formed thereon is used, life time of minority carriers is reduced, and the charges generated below the photoelectric conversion element 11 or the isolation diffusion layer 24 by photoelectric conversion are immediately disappeared. This can prevent leakage of the charges to the adjacent photoelectric conversion element 11.

The photoelectric conversion element 11 is formed to have an impurity concentration, for example, in a range of $1E14$-$1E17/cm^3$. In this case, an impurity concentration of the isolation diffusion layer 23 below the insulating isolation part 22 is preferably higher than the impurity concentration of the photoelectric conversion element 11. This can increase a potential barrier between the photoelectric conversion elements 11, thereby preventing the charges accumulated in the photoelectric conversion element 11 from flowing to the adjacent photoelectric conversion element 11. This can reduce the mixing of colors, and blooming.

The insulating isolation part 22 is preferably formed by shallow trench isolation (STI) to ensure an opening area of the photoelectric conversion element 11, but may be formed by local oxidation of silicon (LOCOS). When the insulating isolation part 22 is formed by the STI, a p-type layer is preferably formed to surround the insulating isolation part 22 to prevent the charges generated in a dark state due to a lattice defect of an interface of the STI from entering the photoelectric conversion element 11.

Figure 4:
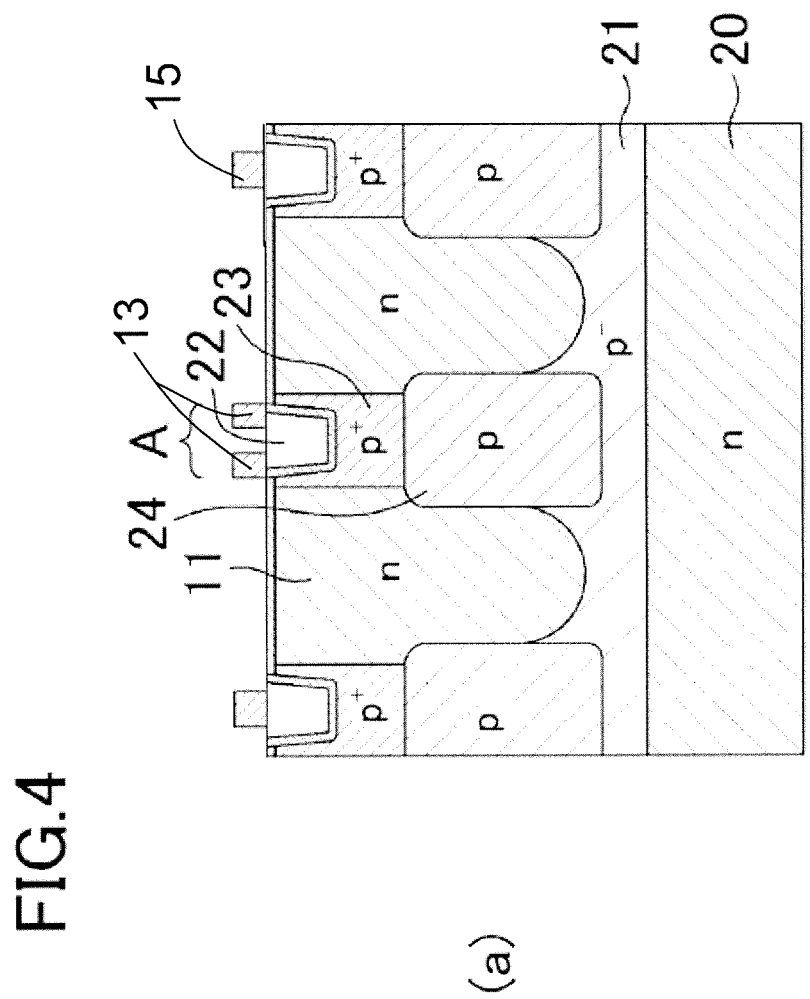
FIGS. 4A and FIG. 4B show an alternative of the first embodiment, i.e.
Figure 4:
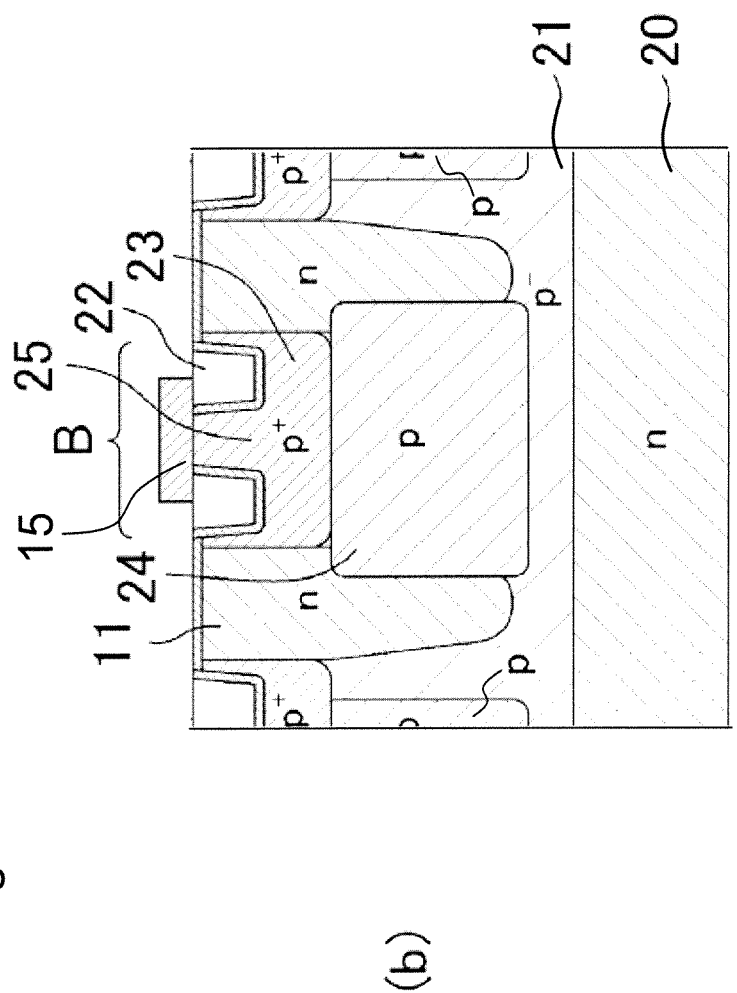

FIGS. 4A and 4B show a structure of pixels 10 according to an alternative of the present embodiment. FIG. 4A is a cross-sectional view taken along the line IIa-IIa shown in FIG. 1, and FIG. 4B is a cross-sectional view taken along the line IIb-IIb shown in FIG. 1.

Feature of this alternative are that a source/drain region of the amplifier transistor 14 between the insulating isolation parts 22 constituting the second regions B is formed in the well region 25 which is formed simultaneously with the first isolation diffusion layer 23 as shown in FIG. 4B, and that the second isolation diffusion layer 24 formed below the insulating isolation part 22 constituting the second region B is wider than the second isolation diffusion layer 24 formed below the insulating isolation part 22 constituting the first region A.

With this configuration, sheet resistance of the well region 25 can be reduced even when the solid state imaging device is miniaturized. For example, when the impurity concentration of the second isolation diffusion layer 24 is $1E18/cm^3$, and the width W2 of the second isolation diffusion layer 24 is increased from 0.4 μm merely by 0.2 μm, the sheet resistance of the well region 25 in the second region B (i.e., sheet resistances of the first and second isolation diffusion layers 23, 24) can be reduced by about 20%. Thus, change in potential of the well region 25 can be reduced even when the amplifier transistor 104 is operated at high speed, thereby allowing high speed operation of the amplifier transistor with stability. Sensitivity to the long wavelength light (red light) is reduced merely by about 2% even when the width $W_2$ of the second isolation diffusion layer 24 is increased to 0.9 μm, as compared with the sensitivity when the width W2 is 0.3 μm.

Figure 5:
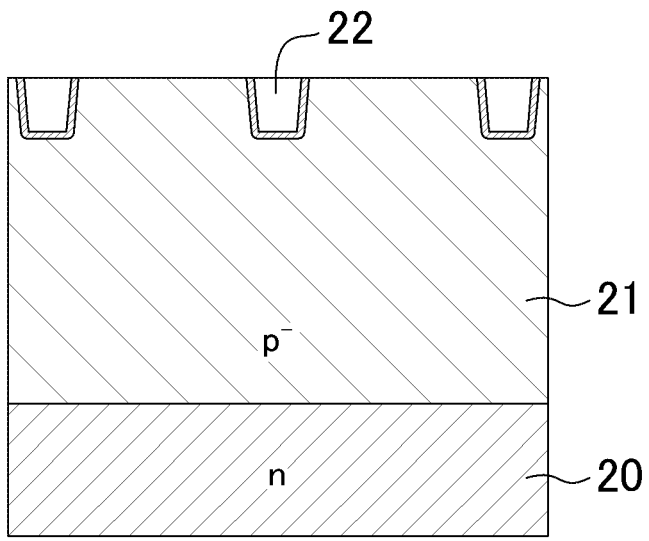
FIGS. 5A to 5C are cross-sectional views illustrating a method for manufacturing the pixels of the embodiment.
Figure 5:
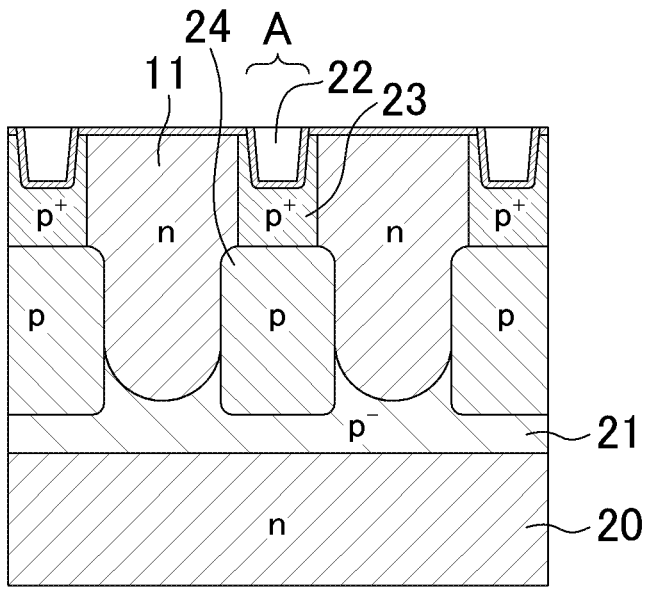
Figure 5:
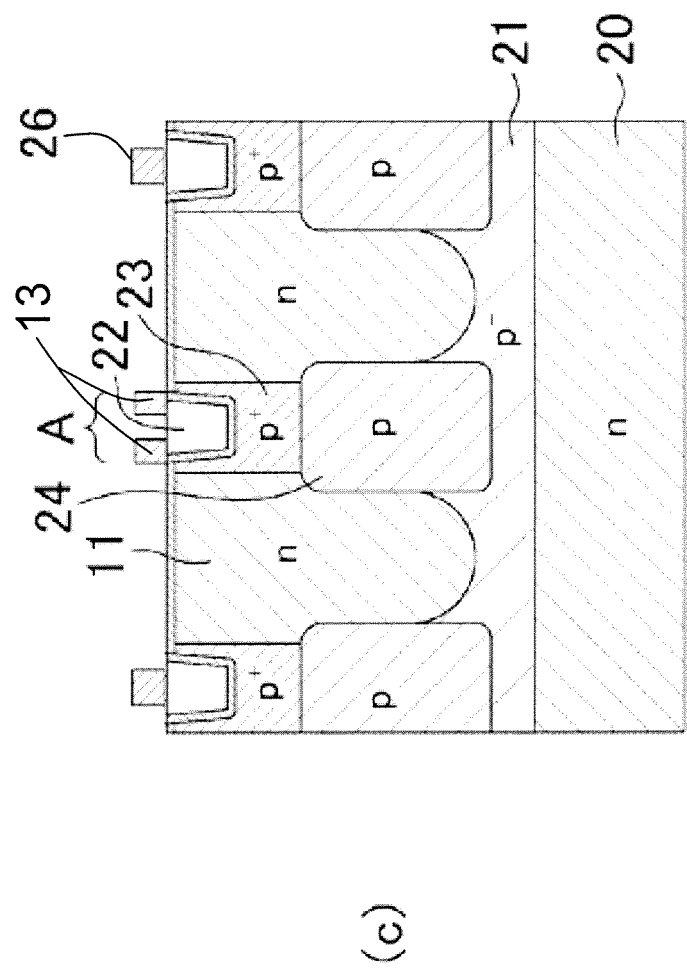

Referring to FIGS. 5A-5C, a method for forming the pixels of the present embodiment will be described. FIGS. 5A-5C are cross-sectional views taken along the line IIa-IIa shown in FIG. 1.

As shown in FIG. 5A, an insulating isolation part 22 is formed by conventional STI in a surface of an n-type semiconductor substrate 20. A p-type layer having an impurity concentration of $1E15/cm^3$-$1E19/cm^3$ is provided on a side wall of the shallow trench constituting insulating isolation part. Then, ion implantation is performed using a resist mask to form a p-type semiconductor layer 21 on a pixel region of the semiconductor substrate 20. An impurity concentration of the p-type semiconductor layer 21 is as low as $1E14/cm^3$-$1E17/cm^3$ to form the photoelectric conversion element extending to a deep region of the p-type semiconductor layer 21.

Then, as shown in FIG. 5B, As or P atoms are implanted by ion implantation using a resist mask having an opening corresponding to a desired region between the insulating isolation parts 22 to form n-type photoelectric conversion elements 11. The ion implantation is performed several times at different implantation energy levels of 200 keV-1600 keV to form the photoelectric conversion elements 11 extending to a deep region of the p-type semiconductor layer 21. The photoelectric conversion element 11 has an impurity concentration of $1E14/cm^3$-$1E17/cm^3$.

Then, B atoms are implanted by ion implantation using a resist mask having an opening corresponding to a desired region between the insulating isolation parts 22 to form a p-type first isolation diffusion layer 23 below the insulating isolation part 22. A well region, in which amplifier transistors, reset transistors, and selection transistors constituting the pixels are formed, and n-type transistors constituting a peripheral circuit are formed, is formed simultaneously with the first isolation diffusion layer 23. The first isolation diffusion layer 23 has an impurity concentration of $1E15/cm^3$-$1E19/cm^3$, and is formed by performing ion implantation several times at different implantation energy levels of 10 keV-500 keV.

Then, B atoms are implanted by ion implantation using a resist mask having an opening corresponding to a desired region between the insulating isolation parts 22 to form a p-type second isolation diffusion layer 24 below the first isolation diffusion layer 23. The opening of the resist mask is larger than the opening formed in the resist mask used to form the first isolation diffusion layer 23. Thus, there is no need to increase resolution for forming the opening of the resist mask, and a thick resist can be used. Accordingly, the second isolation diffusion layer 24 can be formed below the first isolation diffusion layer 23 without causing penetration of the ions through the resist even when the implantation energy is increased. The second isolation diffusion layer 24 has an impurity concentration of $1E15/cm^3$-$1E19/cm^3$, and is formed by performing ion implantation several times at different implantation energy levels of 300 keV-3000 keV. Then, a p-type layer is formed on a surface of the photoelectric conversion element 11 to prevent leakage of charges generated on the surface of the photoelectric conversion element 11 to the inside of the photoelectric conversion element 11. The p-type layer has an impurity concentration of $1E16/cm^3$-$1E20/cm^3$. Then, source/drain regions (not shown) are formed in a transistor region for forming the amplifier transistors etc. by ion implantation using resist mask.

Finally, as shown in FIG. 5C, interconnects 26 are formed on the insulating isolation part 22 to finish the pixel 10 shown in FIG. 1.

The above-described embodiments have been set forth merely for the purposes of preferred examples in nature, and are not intended to limit the scope, applications, and use of the invention. The embodiments may be modified in various ways.

The solid state imaging device of the present disclosure can suitably be used for high-resolution and high-sensitivity solid state imaging devices.

What is claimed is:
1. A solid state imaging device comprising:
   a plurality of pixels arranged in an array pattern, wherein each of the pixels includes:
      a photoelectric conversion element which is formed with a first conductivity type diffusion region formed in a substrate,
      a transfer transistor for transferring charges accumulated in the photoelectric conversion element to a floating diffusion layer, and
      an amplifier transistor for outputting the charges transferred to the floating diffusion layer to an output line, and
   an insulating isolation part which electrically isolates the photoelectric conversion elements adjacent to each other, and electrically isolates the photoelectric conversion element and the amplifier transistor,
   wherein the insulating isolation part constitutes at least a first region between the photoelectric conversion elements where the amplifier transistor is not arranged, and a second region between the photoelectric conversion elements where the amplifier transistor is arranged,
   a second conductivity type isolation diffusion layer is formed around the insulating isolation part,
   the isolation diffusion layer is formed with a first isolation diffusion layer and a second isolation diffusion layer, at least a portion of the second isolation diffusion layer is formed directly below the first isolation diffusion layer,
   at least a portion of the second isolation diffusion layer formed below the insulating isolation part constituting the first region is wider than the first isolation diffusion layer, and
   a source/drain region of the amplifier transistor is disposed in the first isolation diffusion layer so that at least a portion of the first isolation diffusion layer is formed directly below the source/drain region.
2. The solid state imaging device of claim 1, wherein
   at least a portion of the second isolation diffusion layer formed below the insulating isolation part constituting the second region is wider than the at least a portion of the second isolation diffusion layer formed below the insulating isolation part constituting the first region.
3. The solid state imaging device of claim 2, wherein
   an impurity concentration of the first isolation diffusion layer is higher than an impurity concentration of the second isolation diffusion layer.

4. The solid state imaging device of claim 1, wherein
an impurity concentration of the first isolation diffusion layer is higher than an impurity concentration of the second isolation diffusion layer.

5. The solid state imaging device of claim 1, wherein
the first isolation diffusion layer and the second isolation diffusion layer are formed by performing multiple ion implantations at different energy levels.

\* \* \* \* \*